United States Patent
Choi

(10) Patent No.: US 6,977,848 B2
(45) Date of Patent: Dec. 20, 2005

(54) DATA OUTPUT CONTROL CIRCUIT

(75) Inventor: Young-Bae Choi, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 1 day.

(21) Appl. No.: 10/874,326

(22) Filed: Jun. 24, 2004

(65) Prior Publication Data

US 2005/0105376 A1    May 19, 2005

(30) Foreign Application Priority Data

Oct. 31, 2003    (KR) ..................... 10-2003-0076801

(51) Int. Cl.[7] ........................... G11C 11/34; G11C 7/00; G11C 8/00
(52) U.S. Cl. ................. 365/189.05; 365/193; 365/194; 365/233
(58) Field of Search ........................... 365/189.05, 193, 365/194, 233

(56) References Cited

U.S. PATENT DOCUMENTS 6,205,062 B1 * 3/2001 Kim et al. .................. 365/193
6,215,726 B1 * 4/2001 Kubo ......................... 365/194

* cited by examiner

*Primary Examiner*—Zandra V. Smith
*Assistant Examiner*—Anthan Tran
(74) *Attorney, Agent, or Firm*—Mayer, Brown, Rowe & Maw LLP

(57) ABSTRACT

A data output control circuit for use in a synchronous semiconductor memory device, which has a plurality of CAS latency modes, includes a signal generating unit for generating an internal signal corresponding to an input command; a CAS latency mode control unit for outputting the internal signal as a controlled internal signal; a signal shifting unit for generating a plurality of shifted signals by synchronizing the controlled internal signal with a DLL clock signal; and a data output enable signal generating unit for outputting one of the plurality of shifted signals as a data output enable signal depending on a plurality of control signals, wherein each of the plurality of control signals corresponds to two or more continuous CAS latency modes.

12 Claims, 8 Drawing Sheets

DATA OUTPUT CONTROL CIRCUIT

FIELD OF THE INVENTION

The present invention relates to a semiconductor device; and, more particularly, to a data output control circuit for generating a data output enable signal.

DESCRIPTION OF THE PRIOR ART

A semiconductor memory device has been continuously improved to increase its operational speed. One of methods to improve an operational speed of a semiconductor memory device is to make the semiconductor memory device operate in synchronization with an external clock signal. Therefore, a semiconductor memory device which operates in synchronization with the external clock signal, namely a synchronous semiconductor memory device, has been developed.

The synchronous semiconductor memory device performs a data access operation at a rising edge of the external clock signal. That is, the synchronous semiconductor memory device can perform the data access operation once within one cycle of the external clock signal.

Such a synchronous semiconductor memory device that performs the data access operation once within one cycle of the external clock signal is particularly called a single data rate (SDR) synchronous semiconductor memory device.

However, the SDR synchronous semiconductor memory device had to be more improved for use in a high speed system. Therefore, a double data rate (DDR) synchronous semiconductor memory device has been developed. The DDR synchronous semiconductor memory device performs the data access operation at a rising edge and a falling edge of the external clock signal. That is, the DDR synchronous semiconductor memory device performs the data access operation twice within one cycle of the external clock signal.

Since the DDR synchronous semiconductor memory device should perform the data access operation twice within one cycle of the external clock signal, a data access method used in the SDR synchronous semiconductor memory device can not be used in the DDR synchronous semiconductor memory device.

If a cycle of the external clock signal is 10 nano-seconds, the DDR synchronous semiconductor memory device has only about 6 nano-seconds for performing the data access operation because about 4 nano-seconds is spent for other operations such as raising and lowering edges of the external clock signal.

Since 6 nano-seconds is too short time for the DDR synchronous semiconductor memory device to internally handle a data at both edges of the external clock signal, the DDR synchronous semiconductor memory device performs a data access operation at both edges, i.e., a falling edge and a rising edge, of the external clock signal only when a data is inputted into or outputted from the DDR synchronous semiconductor memory device and, thus, the DDR synchronous semiconductor memory device internally performs the data access operation in synchronization with one of the both edges of the external clock signal.

Therefore, a new data access method is required for a data to be inputted into or outputted from the DDR synchronous semiconductor memory device.

For the synchronous semiconductor memory device, some technical terms are used. One of those technical terms is a column address strobe (CAS) latency.

The CAS latency (CL) is the ratio between column access time and a clock cycle time. That is, the CL shows how many cycles of the external clock signal are spent while performing a read operation of a semiconductor memory device. For instance, in case that the CL is 3, if a read command is inputted, a data corresponding to the read command is outputted from a memory cell array after 3 cycles of the external clock signal. Therefore, at an initial state of the synchronous semiconductor memory device, the CL is detected by the synchronous semiconductor memory device and is used for outputting a data.

Meanwhile, the data outputted from the memory cell array is stored in a data output buffer. Then, the data stored in the data output buffer is finally outputted from the synchronous semiconductor memory device in response to an activated data output enable signal. The data output enable signal is generated by delaying a read command performing signal for a time period corresponding to the CL, wherein the read command performing signal is generated in response to the read command. Therefore, the synchronous semiconductor memory device activates the data output enable signal after time of the CL is passed.

Herein, the synchronous semiconductor memory device uses an internal operating clock signal which is outputted from a delay locked loop (DLL). When the external clock signal is inputted to the synchronous semiconductor memory device in order to be used as the internal operating clock signal, there occurs a time error between the external clock signal and the internal operating clock signal. Therefore, the DLL is applied to the synchronous semiconductor memory device for synchronizing the internal operating clock signal with the external clock signal.

FIG. 1 is a block diagram showing a conventional synchronous semiconductor memory device.

As shown, the conventional synchronous semiconductor memory device includes an input buffer 10, a command decoder 20, a read operation timing control unit 30, a data output control unit 40, a data output buffer 50, a data output pad (DQ pad) 60, a delay locked loop (DLL) 70 and a memory core block 80.

The input buffer 10 receives a plurality of command signals such as a chip selection bar signal /CS, a row address strobe bar signal /RAS, a column address strobe bar signal /CAS and a write enable bar signal /WE for buffering and outputting those plurality of command signals. The command decoder 20 receives the plurality of command signals from the input buffer 10 for decoding the plurality of command signals and, thus, to output a control signal such as a read command signal rd.

The read operation timing control unit 30 receives the read command signal rd for generating a read command performing signal casp_rd which corresponds to the read command signal rd. There is a predetermined time difference between a timing of receiving the read command signal rd and a timing of generating the read command performing signal casp_rd. The predetermined time difference corresponds to clock cycles of a clock signal iclk, where the clock cycles of the clock signal iclk is an additive latency (AL).

Herein, the AL is the number of spent clock cycles of the clock signal iclk while a tRCD (RAS to CAS delay) is passed after the read command signal rd is inputted to the read operation timing control unit 30. The tRCD is a time difference between an input timing of a row address and an input timing of a column address.

When the row address is inputted, the conventional synchronous semiconductor memory device is activated, and, then, the column address is inputted after the tRCD is passed. However, the read command signal rd is inputted prior to the column address after the row address is inputted.

That is, the AL is a time difference between an input timing of the read command signal rd and an input timing of the column address.

The memory core block 80 outputs a data to the data output buffer 50 in response to the read command performing signal casp_rd, where the data inputted to the data output buffer 50 corresponds to an address signal addr.

The DLL 70 generates two delay locked clock signals, i.e., a delay locked falling edge clock signal fclk_dll and a delay locked rising edge clock signal rclk_dll by delay locking the clock signal iclk. The delay locked falling edge clock signal fclk_dll and the delay locked rising edge clock signal rclk_dll are used for a data to be outputted from the conventional synchronous semiconductor memory device synchronizing with a falling edge and a rising edge of an external clock signal.

The data output control unit 40 receives the read command performing signal casp_rd, the clock signal iclk, the delay locked falling edge clock signal fclk_dll and the delay locked rising edge clock signal rclk_dll for generating two data output enable signals, i.e., a rising data output enable signal routen and a falling data output enable signal fouten.

Herein, prior to outputting the rising data output enable signal routen and the falling data output enable signal fouten, there is a delay time corresponding to the CL. That is, after the data output control unit 40 receives the read command performing signal casp_rd, the rising data output enable signal routen and the falling data output enable signal fouten are outputted from the data output control unit 40 after the delay time corresponding to the CL is passed.

Herein, when the rising data output enable signal routen and the falling data output enable signal fouten are outputted, they are synchronized with the delay locked rising edge clock signal rclk_dll and the delay locked falling edge clock signal fclk_dll. The rising data output enable signal routen and the falling data output enable signal fouten respectively serve to output the data synchronously with a rising edge of the clock signal iclk and a falling edge of the clock signal iclk.

The data output buffer 50 receives the data from the memory core block 80 for outputting the received data to the DQ pad in response to the rising data output enable signal routen and the falling data output enable signal fouten.

FIG. 2 is a block diagram showing the data output control unit 40 shown in FIG. 1.

As shown, the data output control unit 40 includes a signal generating unit 41, a DLL output pulse control unit 42, a signal transferring unit 43 and a signal output unit 44.

The signal generating unit 41 generates an internal signal oe00 by synchronizing the read command performing signal casp_rd with the clock signal iclk.

The DLL output pulse control unit 42 receives the delay locked rising edge clock signal rclk_dll and the delay locked falling edge clock signal fclk_dll for generating a plurality of delayed delay locked rising edge clock signals rclk_dll_oe10 to rclk_dll_oe40 and a plurality of delayed delay locked falling edge clock signals fclk_dll_oe15 to fclk_dll_oe45. Herein, the rclk_dll_oe10 is generated by delaying the delay locked rising edge clock signal rclk_dll for a time period corresponding to a first CL mode CL2, where the first CL mode CL2 means that a current CL is 2.

Likewise, the rclk_dll_oe20, the rclk_dll_oe30 and the rclk_dll_oe40 are generated by delaying the delay locked rising edge clock signal rclk_dll for a time period corresponding to a second CL mode CL3, a third CL mode CL4 and a fourth CL mode CL5 respectively.

The plurality of delayed delay locked falling edge clock signals fclk_dll_oe15 to fclk_dll_oe45 are generated by delaying the delay locked falling edge clock signal fclk_dll for a time period corresponding to the first to the fourth CL modes CL2 to CL5 respectively.

The signal transferring unit 43 receives the internal signal oe00 and the plurality of delayed delay locked rising edge clock signals rclk_dll_oe10 to rclk_dll_oe40 and outputs the plurality of delayed delay locked rising edge clock signals rclk_dll_oe10 to rclk_dll_oe40 as a plurality of synchronized internal signals oe10_dll to oe40_dll synchronously with the internal signal oe00.

The signal output unit 40 receives the plurality of synchronized internal signals oe10_dll to oe40_dll and output one of the received signals as the rising data output enable signal routen.

Herein, the data output control unit 40 further includes a falling data output enable signal generating unit 46 which receives the internal signal oe00 and the plurality of delayed delay locked falling edge clock signals fclk_dll_oe15 to fclk_dll_oe45 for generating the falling data output enable signal fouten. The falling data output enable signal generating unit 46 includes a signal transferring unit and a signal output unit whose operation and structure are the same as those of the signal transferring unit 43 and the signal output unit 44 described above. Therefore, a detailed description of the falling data output enable signal generating unit 46 is omitted.

The signal transferring unit 43 includes a first to a fourth D-type flip-flops F1 to F4. The first D-type flip-flop F1 receives the internal signal oe00 and the rclk_dll_oe10 through its data input terminal D and a clock input terminal respectively for outputting the oe10_dll through its main output terminal Q. The second D-type flip-flop F2 receives a signal outputted from a sub output terminal/Q of the first D-type flip-flop F1 through its data input terminal D and also receives the rclk_dll_oe20 through its clock input terminal for outputting the oe20_dll.

Likewise, the third D-type flip-flop F3 and the fourth D-type flip-flop F4 generate the oe30_dll and the oe40_dll respectively.

The signal output unit 40 includes a first to a fourth transferring gates T1 to T4 which are selectively turned on by the first to the fourth CL modes CL2 to CL5 for outputting one of the plurality of synchronized internal signals oe10_dll to oe40_dll as the rising data output enable signal routen.

Herein, the signal output unit 40 is enabled by a power-up signal pwrup. The power-up signal pwrup is activated when a power supply voltage reaches a stable voltage level at an initial state of the synchronous semiconductor memory device.

FIG. 3 is a timing diagram showing an operation of the data output control unit 40 shown in FIG. 2.

The operation of the data output control unit 40 is described below referring to FIG. 3.

The signal generating unit 41 receives the read command performing signal casp_rd and the clock signal iclk for outputting the internal signal oe00 synchronizing with the clock signal iclk.

Meanwhile, the DLL output pulse control unit 42 delays the delay locked rising edge clock signal rclk_dll and the delay locked falling edge clock signal fclk_dll for outputting the plurality of delayed delay locked rising edge clock signals rclk_dll_oe10 to rclk_dll_oe40. Herein, the delay time is determined by the first to the fourth CL modes CL2 to CL5. That is, the rclk_dll_oe10 is generated by delaying the delay locked rising edge clock signal rclk_dll for a time period corresponding to the first CL mode CL2. Likewise, the rclk_dll_oe20, the rclk_dll_oe30 and the rclk_dll_oe40 are generated as described above.

Thereafter, the plurality of delayed delay locked rising edge clock signals rclk_dll_oe10 to rclk_dll_oe40 outputted from the DLL output pulse control unit 42 are inputted to the first to the fourth D-type flip-flops F1 to F4 respectively. Then, the first to the fourth D-type flip-flops F1 to F4 outputs the plurality of synchronized internal signals oe10_dll to oe40_dll respectively. Each of the plurality of synchronized internal signals oe10_dll to oe40_dll has the same wave form as that of the internal signal oe00. However, as shown in FIG. 3, rising edges of the plurality of synchronized internal signals oe10_dll to oe40_dll are synchronized with different rising edges of the delay locked rising edge clock signal rclk_dll.

Thereafter, one of the first to the fourth transferring gates T1 to T4 is turned on depending on a current CL mode, and, thus one of the plurality of synchronized internal signals oe10_dll to oe40_dll is outputted to a node N. Then, a signal outputted to the node N is inputted to inverters I6 and I7, and is finally outputted as the rising data output enable signal routen. The power-up signal pwrup is activated when the power supply voltage is stabled to thereby enable the signal output unit 44 by turning on a metal oxide semiconductor (MOS) transistor MN1.

As shown in FIG. 3, since the oe30_dll is outputted as the rising data output enable signal routen, a current CL is 4. In this case, the third transferring gate T3 is turned on by the third CL mode CL4, and, thus the oe30_dll is passed through the third transferring gate T3 and is outputted as the rising data output enable signal routen.

Therefore, at an activated period of the rising data output enable signal routen, a data is outputted to the DQ pad.

The data output control unit 40 shown in FIG. 2 is designed to be applied to a semiconductor memory device whose CL is 2, 3, 4 or 5.

However, the CL is required to be extended as a semiconductor memory device is highly integrated.

FIG. 4 is a schematic circuit diagram showing an extended signal output unit 44' which is an improved version of the signal output unit 44 for supporting eight CL modes, i.e., CL2 to CL9.

As shown, the extended signal output unit 44' includes eight transferring gates, i.e., T5 to T12 for supporting the eight CL modes. Although not shown, the signal transferring unit 43 must include eight D-type flip-flops. Likewise, the signal transferring unit and the signal output unit included in the falling enable signal generating unit 46 should be provided with eight D-type flip-flops and eight transferring gates respectively.

However, in case of the extended signal output unit 44, an electrical load on a second node N' is increased compared to that of the signal output unit 44. Therefore, a rising time at the second node N' is highly increased, and the rising data output enable signal routen is not generated at a proper timing. In addition, an operational speed is slowed and a circuit of a semiconductor memory device is complicated.

SUMMARY OF THE INVENTION

It is, therefore, an object of the present invention to provide a data output control circuit having extended CAS latency modes without an additional circuit and an operational speed drop.

In accordance with an aspect of the present invention, there is provided a data output control circuit for use in a synchronous semiconductor memory device which has a CAS latency mode including a signal generating unit for generating an internal signal which corresponds to a read command; a CAS latency mode control unit for receiving the internal clock signal and outputting the internal signal as a controlled internal signal without delay or after a delay time which corresponds to predetermined cycles of a clock signal is passed depending on the CAS latency mode; a signal shifting unit for generating a plurality of shifted signals by synchronizing the controlled internal signal with a DLL clock signal; and a data output enable signal generating unit for outputting one of the plurality of shifted signals as a data output enable signal depending on a plurality of control signals, wherein each of the plurality of control signals corresponds to two or more continuous CAS latency modes.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a data output control circuit for use in a semiconductor memory device in accordance with the present invention will be described in detail referring to the accompanying drawings.

Figure 5:
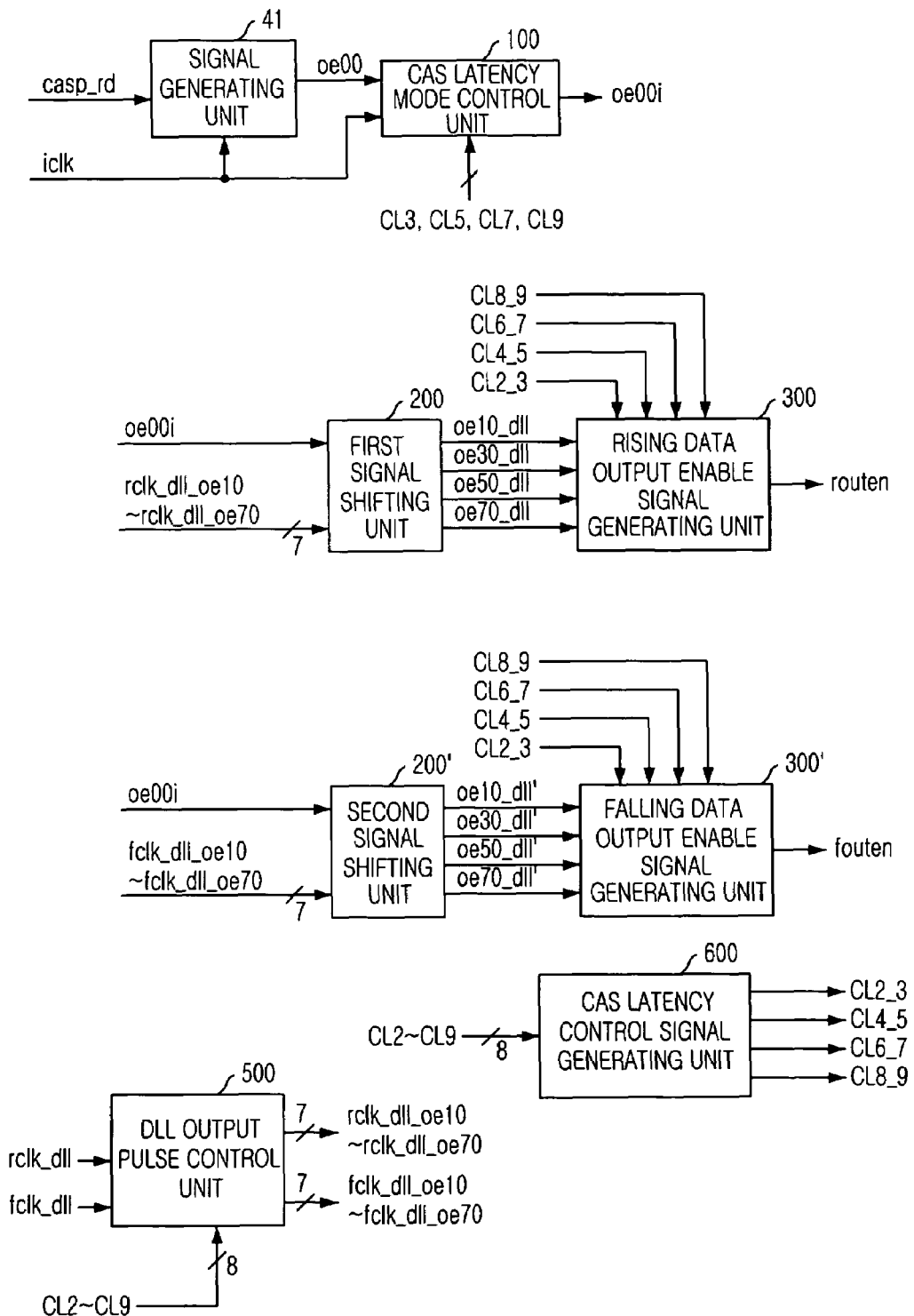
FIG. 5 is a block diagram showing a data output control circuit in accordance with a preferred embodiment of the present invention.

FIG. 5 is a block diagram showing a data output control circuit in accordance with a preferred embodiment of the present invention.

As shown, the data output control circuit includes a signal generating unit 41, a column address strobe (CAS) latency mode control unit 100, a first signal shifting unit 200, a rising data output enable signal generating unit 300, a second signal shifting unit 200', a falling data output enable signal generating unit 300', a CAS latency control signal generating unit 600 and a DLL output pulse control unit 500.

The signal generating unit 41 generates an internal signal oe00 in response to a read command performing signal casp_rd. The CAS latency mode control unit 100 receives the internal signal oe00 and outputs the received internal signal oe00 as a controlled internal signal oe00i.

Herein, if a CAS latency (CL) is 3, 5, 7 or 9, the CAS latency mode control unit 100 outputs the controlled internal signal oe00i without delay after receiving the internal signal oe00. On the other hand, if the CL is 2, 4, 6 or 8, the CAS latency mode control unit 100 outputs the controlled internal signal oe00i after a predetermined delay time is passed. The predetermined delay time corresponds to one cycle of a clock signal iclk.

The first signal shifting unit 200 receives the controlled internal signal oe00i and a plurality of delayed delay-locked rising edge clock signals rclk_dll_oe10 to rclk_dll_oe70 in order to output a plurality of shifted internal signals oe10_dll to oe70_dll. Herein, the shifted internal signals oe10_dll, oe30_dll, oe50_dll and oe70_dll are generated by synchronizing the controlled internal signal oe00i with the delayed delay-locked rising edge clock signals rclk_dll_oe10, rclk_dll_oe30, rclk_dll_oe50 and rclk_dll_oe70 respectively.

The rising data output enable signal generating unit 300 receives the plurality of shifted internal signals oe10_dll to oe70_dll and a plurality of control signals CL2_3 to CL8_9 for outputting one of the plurality of shifted internal signals oe10_dll to oe70_dll as a rising data output enable signal routen. Herein, in case that the CL is 2 or 3, the shifted internal signal oe10_dll is outputted as the rising data output enable signal routen in response to the control signal CL2_3. If the CL is 4 or 5, the shifted internal signal oe30_dll is outputted as the rising data output enable signal routen in response to the control signal CL4_5. Likewise, if the CL is 6 or 7, the shifted internal signal oe50_dll is outputted as the rising data output enable signal routen in response to the control signal CL6_7, or, if the CL is 8 or 9, the shifted internal signal oe70_dll is outputted as the rising data output enable signal routen in response to the control signal CL8_9.

The second signal shifting unit 200' receives the controlled internal signal oe00i and a plurality of delayed delay-locked falling edge clock signals fclk_dll_oe10 to fclk_dll_oe70 in order to output a plurality of shifted internal signals oe10_dll' to oe70_dll'. Herein, the shifted internal signals oe10_dll', oe30_dll', oe50_dll' and oe70_dll' are generated by synchronizing the controlled internal signal oe00i with the delayed delay-locked falling edge clock signals fclk_dll_oe10, fclk_dll_oe30, fclk_dll_oe50 and fclk_dll_oe70 respectively.

The falling data output enable signal generating unit 300' receives the plurality of shifted internal signals oe10_dll' to oe70_dll' and the plurality of control signals CL2_3 to CL8_9 for outputting one of the plurality of shifted internal signals oe10_dll' to oe70_dll' as a falling data output enable signal fouten. Herein, in case that the CL is 2 or 3, the shifted internal signal oe10_dll' is outputted as the falling data output enable signal fouten in response to the control signal CL2_3. If the CL is 4 or 5, the shifted internal signal oe30_dll' is outputted as the falling data output enable signal fouten in response to the control signal CL4_5. Likewise, if the CL is 6 or 7, the shifted internal signal oe50_dll' is outputted as the falling data output enable signal fouten in response to the control signal CL6_7, or, if the CL is 8 or 9, the shifted internal signal oe70_dll' is outputted as the falling data output enable signal fouten in response to the control signal CL8_9.

Meanwhile, an operation and a structure of the second signal shifting unit 200' are the same as those of the first signal shifting unit 200. Likewise, an operation and a structure of the falling data output enable signal generating unit 300' are the same as those of the rising data output enable signal generating unit 300. Therefore, a detailed description of the second signal shifting unit 200' and the falling data output enable signal generating unit 300' is omitted.

As described above, each of the plurality of control signals CL2_3 to CL8_9 corresponds to two CL modes, e.g., the CL2_3 corresponds to CL2 and CL3. However, it is also possible that each of the plurality of control signals CL2_3 to CL8_9 corresponds to three or more CL modes.

Therefore, since each of the plurality of control signals CL2_3 to CL8_9 corresponds to two CL modes in case of the data output control circuit in accordance with the preferred embodiment, the CAS latency mode control unit 100 outputs the controlled internal signal oe00i without delay when the CL is even or outputs the controlled internal signal oe00i after the predetermined delay time is passed when the CL is odd.

However, if the data output control circuit is modified so that each of the plurality of control signals CL2_3 to CL8_9 can correspond to three CL modes, the CAS latency mode control unit 100 outputs the controlled internal signal oe00i without delay or after a predetermined delay time which corresponds to one cycle of the clock signal iclk is passed or after a predetermined delay time which corresponds to two cycles of the clock signal iclk is passed depending on the CL.

The CAS latency control signal generating unit 600 receives a plurality of CAS latency modes CL2 to CL9 for generating the plurality of control signals CL2_3 to CL8_9.

The CAS latency mode CL2 is activated when the CL is 2. Likewise, the CAS latency modes CL3 to CL9 are activated when the CL is 3, 4, 5, 6, 7, 8 or 9 respectively. Herein, if the CL is 2 or 3, the control signal CL2_3 is activated. If the CL is 4 or 5, the control signal CL4_5 is activated. Likewise, if the CL is 6 or 7, the control signal CL6_7 is activated, or, if the CL is 8 or 9, the control signal CL8_9 is activated. Since a detailed circuit for performing the operation of the CAS latency control signal generating unit 600 is well known to those skilled in the art, a detailed circuit diagram of the CAS latency control signal generating unit 600 is omitted.

Figure 1:
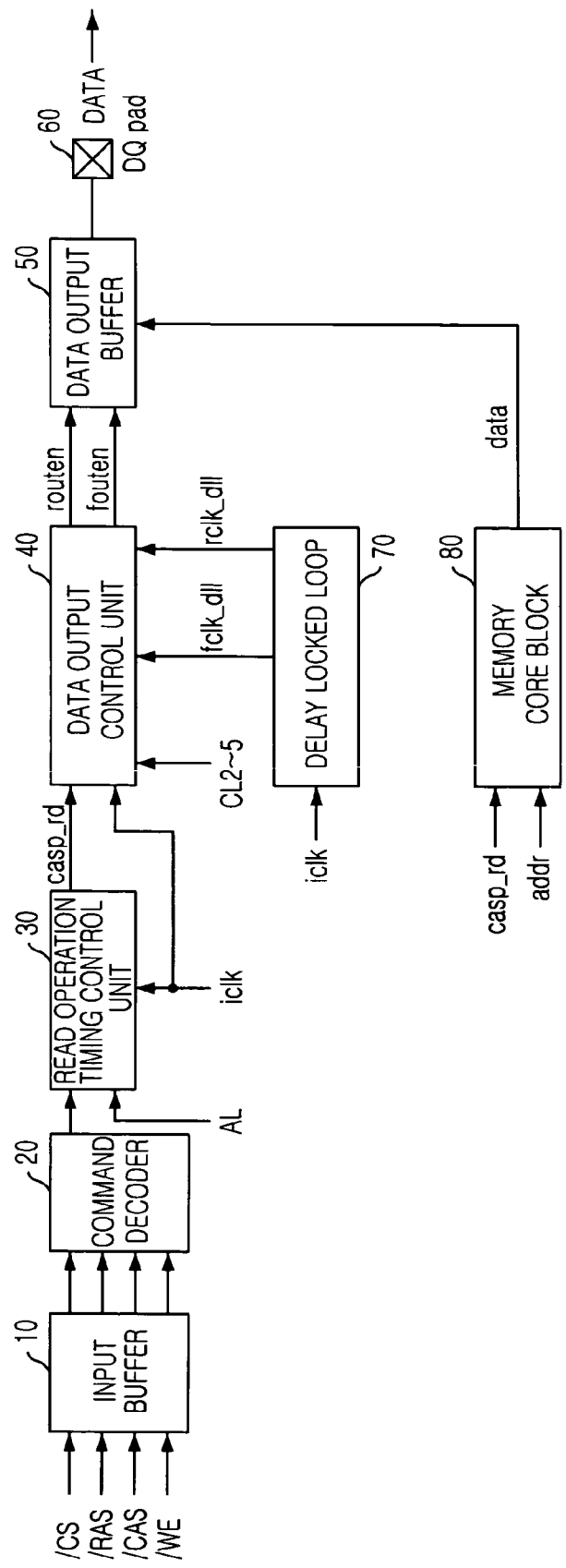
FIG. 1 is a block diagram showing a conventional synchronous semiconductor memory device.
Figure 2:
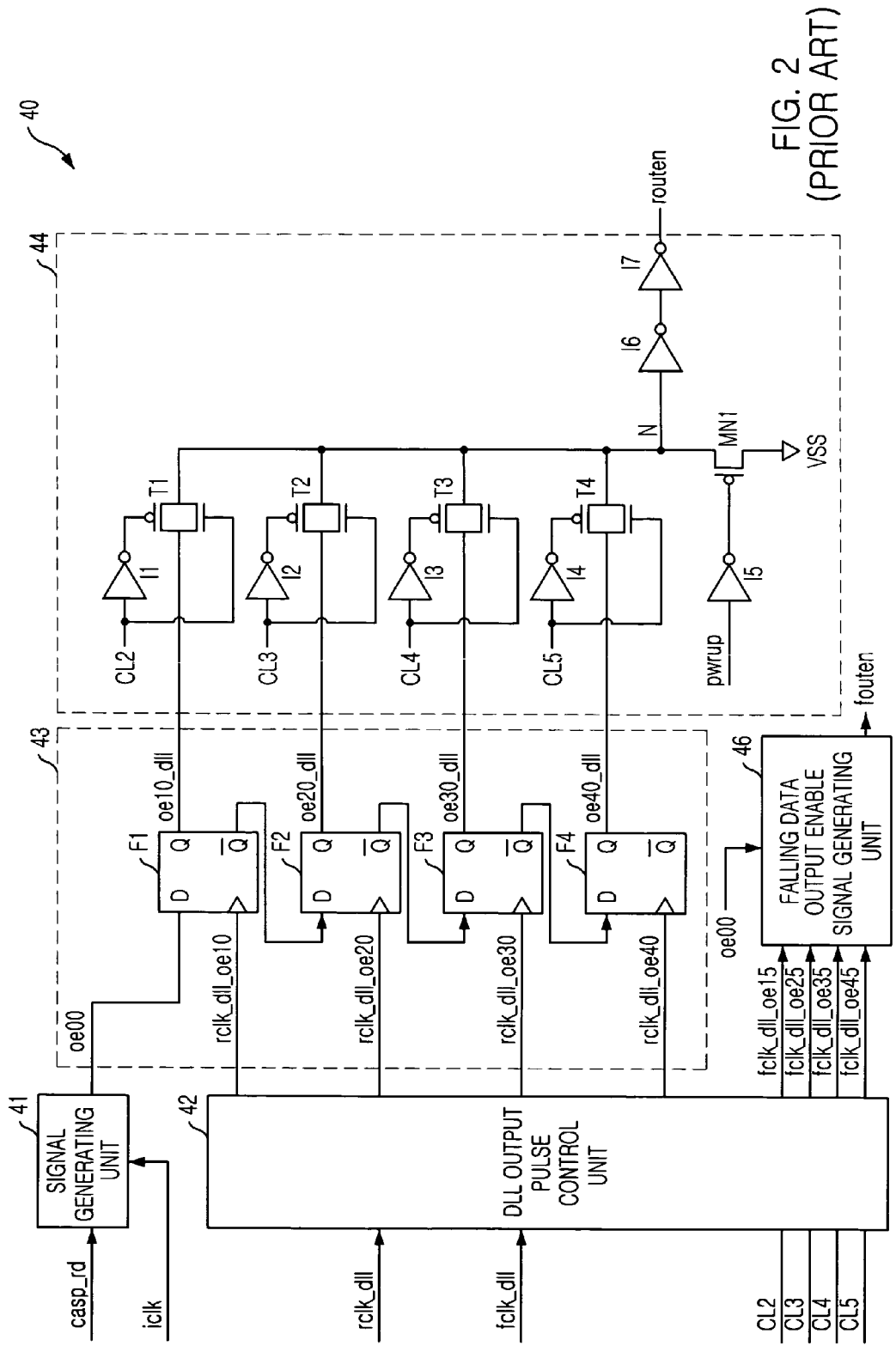
FIG. 2 is a block diagram showing a data output control unit shown in FIG. 1.
Figure 3:
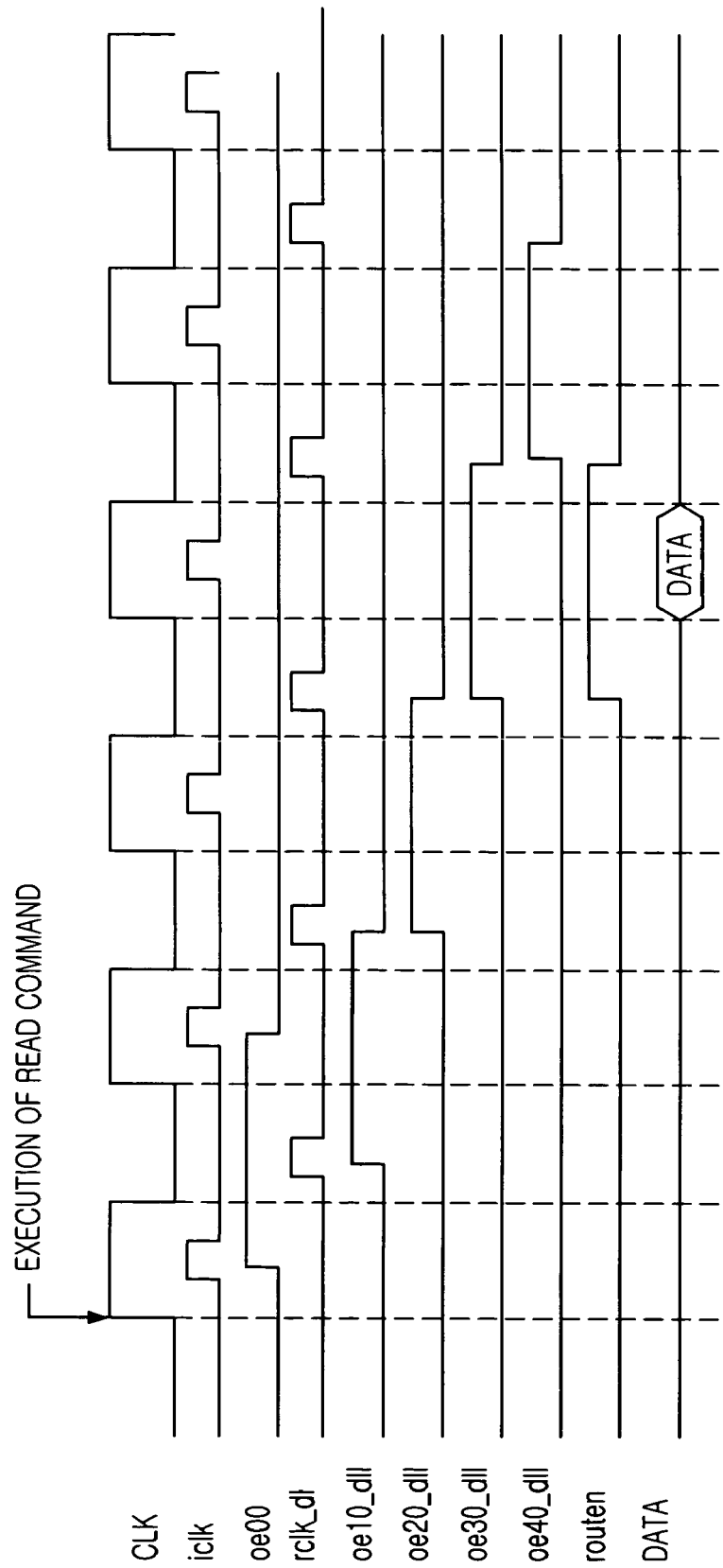
FIG. 3 is a timing diagram showing an operation of a data output control unit shown in FIG. 2.
Figure 4:
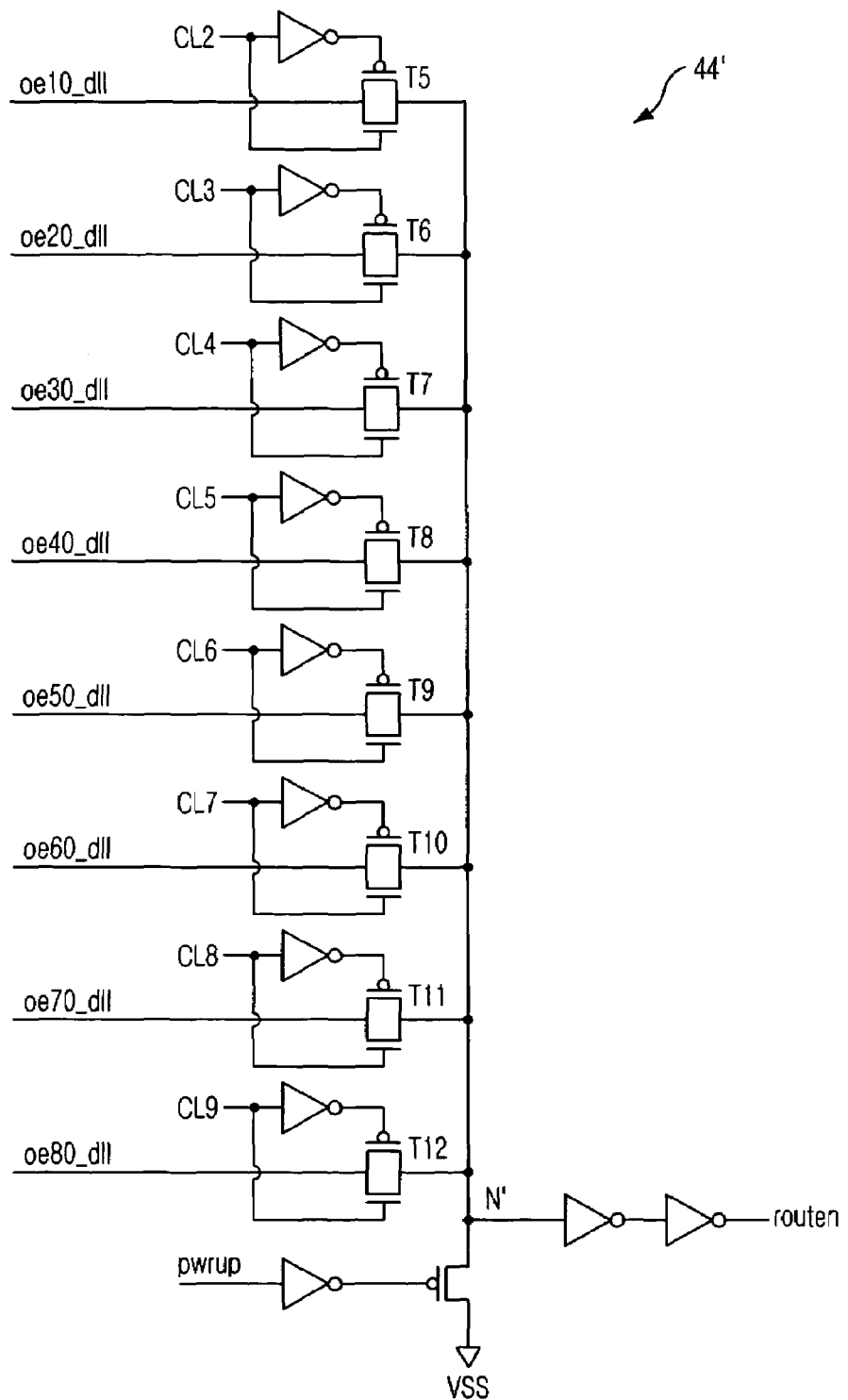
FIG. 4 is a schematic circuit diagram showing an extended signal output unit.

The DLL output pulse control unit 500 receives the delay-locked rising edge clock signal rclk_dll and the delay-locked falling edge clock signal fclk_dll for generating the plurality of delayed delay-locked rising edge clock signals rclk_dll_oe10 to rclk_dll_oe70 and the plurality of delayed delay-locked falling edge clock signals fclk_dll_oe10 to fclk_dll_oe70. Herein, the plurality of delayed delay-locked rising edge clock signals rclk_dll_oe10 to rclk_dll_oe70 are generated by delaying the delay-locked rising edge clock signal rclk_dll for different time periods depending on the plurality of CAS latency modes CL2 to CL9. Likewise, the plurality of delayed delay-locked falling edge clock signals fclk_dll_oe10 to fclk_dll_oe70 are generated by delaying the delay-locked falling edge clock signal fclk_dll for different time periods depending on the plurality of CAS latency modes CL2 to CL9. The DLL output pulse control unit 500 is similar to the DLL output pulse control unit 42 shown in FIG. 2, and those skilled in the art can easily modify the DLL output pulse control unit 42 in order to make the DLL output pulse control unit 500.

Figure 6:
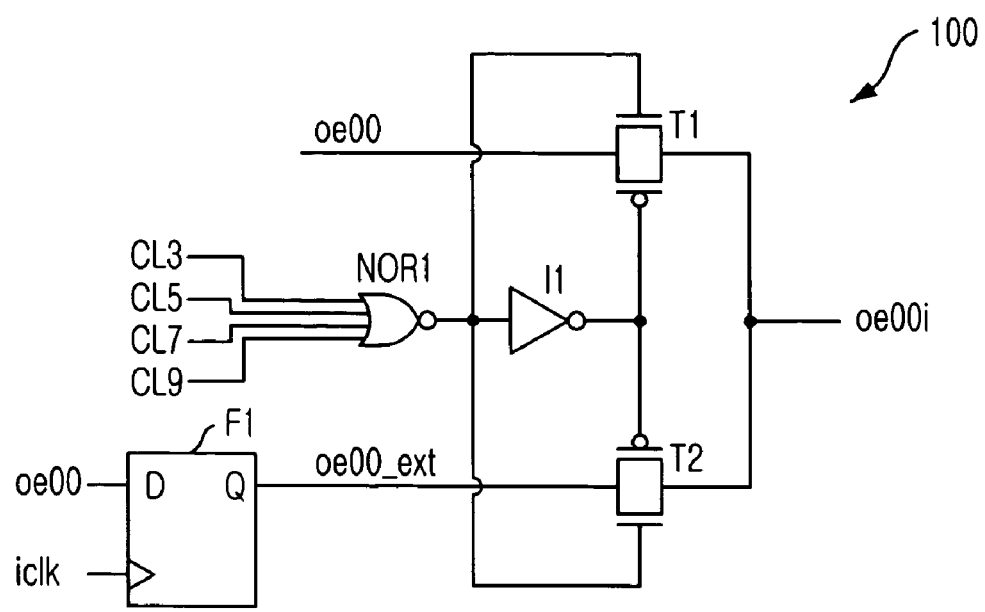
FIG. 6 is a schematic circuit diagram showing a CAS latency mode control unit.

FIG. 6 is a schematic circuit diagram showing the CAS latency mode control unit 100.

As shown, the CAS latency mode control unit 100 includes a first transferring gate T1, a second transferring gate T2 and a D-type flip-flop F1.

If the CL is 2, 4, 6 or 8, the first transferring gate T1 is turned on, and, thus the internal signal oe00 is outputted as the controlled internal signal oe00i through the first transferring gate T1.

The D-type flip-flop F1 delays the internal signal oe00 for a predetermined time which corresponds to one cycle of the clock signal iclk. If the CL is 3, 5, 7 or 9, the second transferring gate T2 is turned on, and, thus a delayed internal signal oe00_ext is outputted as the controlled internal signal oe00i through the second transferring gate T2.

Herein, the D-type flip-flop F1 receives the clock signal iclk through its clock input terminal and receives the internal clock signal oe00 through its data input terminal.

Figure 7:
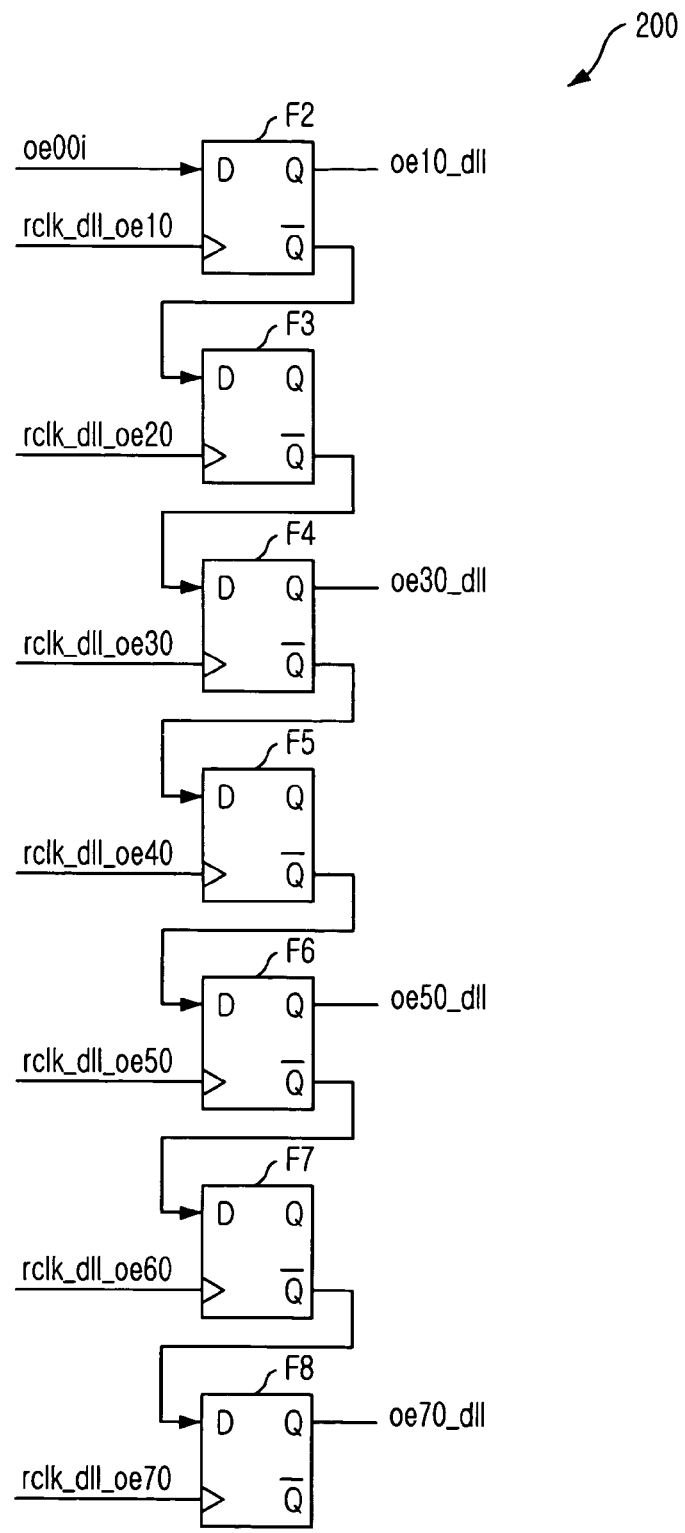
FIG. 7 is a schematic circuit diagram showing a signal shifting unit shown in FIG. 5.

FIG. 7 is a schematic circuit diagram showing the signal shifting unit 200 shown in FIG. 5.

As shown, the signal shifting unit 200 includes a plurality of D-type flip-flops F2 to F8.

The plurality of D-type flip-flops F2 to F8 respectively receive the plurality of delayed delay-locked rising edge clock signals rclk_dll_oe10 to rclk_dll_oe70 through their clock input terminals. The D-type flip-flop F2 receives the controlled internal signal oe00i and each of the other D-type flip-flops, i.e., the D-type flip-flops F3 to F8, receives an output signal from a sub output terminal of a previous D-type flip-flops through its data input terminal. That is, the D-type flip-flop F3 receives an output signal from a sub output terminal of the D-type flip-flop F2, the D-type flip-flop F4 receives an output signal from a sub output terminal of the D-type flip-flop F3, and so on.

Among outputted signals from main output terminals of the plurality of D-type flip-flops F2 to F8, outputted signals from main output terminals of the D-type flip-flops F2, F4, F6 and F8 are used as the plurality of shifted internal signals oe10_dll to oe70_dll respectively.

Figure 8:
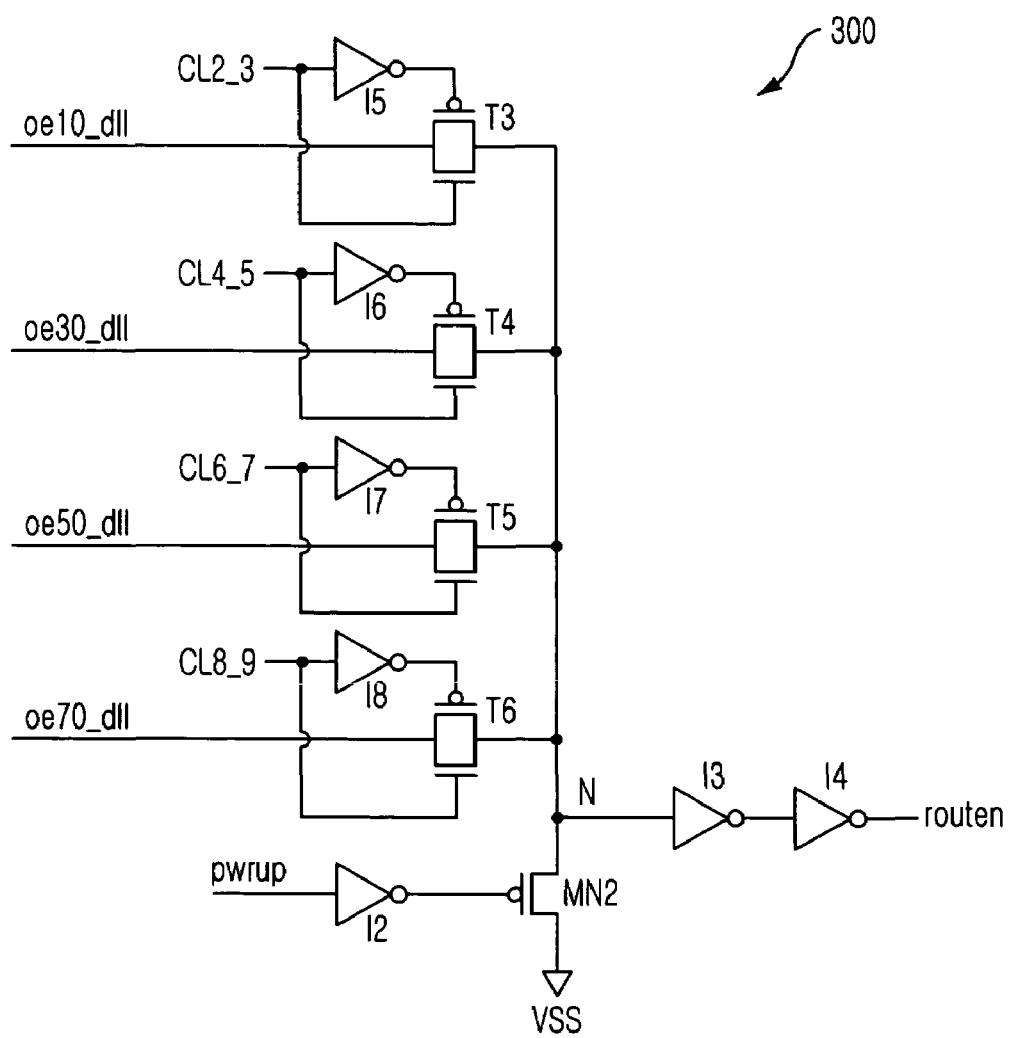
FIG. 8 is a schematic circuit diagram showing a rising data output enable signal generating unit shown in FIG. 5.

FIG. 8 is a schematic circuit diagram showing the rising data output enable signal generating unit 300 shown in FIG. 5.

As shown, the rising data output enable signal generating unit 300 includes a plurality of inverters I2 to I8, a metal oxide semiconductor (MOS) transistor MN2 and a third to a sixth transferring gates T3 to T6.

The third to the sixth transferring gates T3 to T6 are selectively turned on by the plurality of control signals CL2_3 to CL8_9 for outputting one of the plurality of delayed delay-locked rising edge clock signals oe10_dll to oe70_dll. Then, an outputted signal from one of the third to the sixth transferring gates T3 to T6 is inputted to the inverters I3 and I4 to be outputted as the rising data output enable signal routen.

The MOS transistor MN2 servers to enable the rising data output enable signal generating unit 300 in response to a power-up signal pwrup. The MOS transistor MN2 receives the power-up signal pwrup which is in a logic low level from the inverter I2 through a gate of the MOS transistor MN2, and, thus a node N is connected to a ground voltage VSS.

An operation of the data output control circuit in accordance with the preferred embodiment of the present invention is described below referring to FIGS. 5 to 8.

After a read command signal is inputted to the semiconductor memory device, the read command performing signal casp_rd is generated in response to the read command signal, and the read command performing signal casp_rd is inputted to the signal generating unit 41. The signal generating unit 41 generates the internal signal oe00 by synchronizing the read command signal casp_rd with the clock signal iclk.

Thereafter, the CAS latency mode control unit 100 receives the internal signal oe00 from the signal generating unit 41 to output the internal signal oe00 as the controlled internal signal oe00i. Herein, the internal signal oe00 is outputted as the controlled internal signal oe00i without delay or after the predetermined delay time which corresponds to one cycle of the clock signal iclk depending on the CL.

That is, if the CL is 2, 4, 6 or 8, the internal signal oe00 is outputted as the controlled internal signal oe00i without delay. On the other hand, if the CL is 3, 5, 7 or 8, the internal signal oe00 is outputted as the controlled internal signal oe00i after the predetermined delay time which corresponds to one cycle of the clock signal iclk.

As shown in FIG. 6, when the CL is 2, 4, 6 or 8, the first transferring gate T1 is turned on so that the internal signal oe00 is outputted as the controlled internal signal oe00i without delay. When the CL is 3, 5, 7 or 9, the second transferring gate T2 is turned on, and, thus the internal signal oe00 is outputted as the oe00i after being delayed for the predetermined delay time by the D-type flip-flop F1.

Thereafter, the signal shifting unit 200 including the plurality of D-type flip-flops F2 to F8 receives the controlled internal signal oe00i and the plurality of delayed delay-locked rising edge clock signals rclk_dll_oe10 to rclk_dll_oe70 in order to output the plurality of shifted internal signals oe10_dll to oe70_dll. Herein, the shifted internal signals oe10_dll, oe30_dll, oe50_dll and oe70_dll are generated by synchronizing the controlled internal signal oe00i with the delayed delay-locked rising edge clock signals rclk_dll_oe10, rclk_dll_oe30, rclk_dll_oe50 and rclk_dll_oe70 respectively. Subsequently, the controlled internal signal oe00i is outputted after being shifted. The plurality of delayed delay-locked rising edge clock signals rclk_dll_oe10 to rclk_dll_oe70 are used for shifting the internal signal oe00i at an accurate timing.

The plurality of delayed delay-locked rising edge clock signals rclk_dll_oe10 to rclk_dll_oe70 are outputted from the DLL output pulse control unit 500. The plurality of delayed delay-locked rising edge clock signals rclk_dll_oe10 to rclk_dll_oe70 are generated by delaying the delay-locked rising edge clock signal rclk_dll for different time periods depending on the plurality of CAS latency modes CL2 to CL9.

Meanwhile, the rising edge clock signal rclk_dll is outputted from a DLL. The DLL serves to generate the rising edge clock signal rclk_dll and a falling edge clock signal fclk_dll for outputting a data in synchronization with a rising edge and a falling edge of an external clock signal.

The CAS latency control signal generating unit 600 activates and outputs one of the plurality of control signals CL2_3 to CL8_9 depending on the CL. That is, if the CL is 2 or 3, the CL2_3 is activated. Likewise, if the CL is 4 or 5, the CL4_5 is activated, and so on.

Thereafter, the rising data output enable signal generating unit 300 receives the plurality of delayed delay-locked rising edge clock signals oe10_dll to oe70_dll for outputting one of the received plurality of delayed delay-locked rising edge clock signals oe10_dll to oe70_dll as the rising data output enable signal routen.

It is determined by the plurality of control signals CL2_3 to CL8_9 which of the plurality of delayed delay-locked rising edge clock signals oe10_dll to oe70_dll is outputted as the rising data output enable signal routen. That is, if the control signal CL2_3 is activated, the third transferring gate T3 is turned on, thus the delayed delay-locked rising edge clock signal oe10_dll is outputted as the rising data output enable signal routen. Likewise, if the control signal CL4_5 is activated, the fourth transferring gate T4 is turned on so that the delayed delay-locked rising edge clock signal oe30_dll can be outputted as the rising data output enable signal routen, and so on.

Herein, the rising data output enable signal generating unit 300 is enabled by the power-up signal pwrup which is activated when a power supply voltage reaches a stable voltage level at an initial state of the semiconductor memory device.

As described above, the data output control circuit supports extended CAS latency modes, and an electrical load at the node N is not increased comparing to a conventional data output control circuit.

Therefore, the data output control circuit can generate a data output enable signal stably even if the CL is extended.

That is, a data can be outputted stably without an error regardless of the CL.

Therefore, since the data output control circuit supports extended CAS latency modes, a broad-banded operational frequency is also supported.

In addition, since the number of transferring gates included in the rising data output enable signal generating unit 300 is not increases compared to the conventional data output control circuit 300, it is prevented that a size of the semiconductor memory device is increased.

Meanwhile, in accordance with the preferred embodiment, each of the plurality of control signals CL2_3 to CL8_9 corresponds to two CL modes, e.g., the CL2_3 corresponds to CL2 and CL3. However, it is also possible that each of the plurality of control signals CL2_3 to CL8_9 corresponds to three or more CL modes.

If the data output control circuit is modified so that each of the plurality of control signals CL2_3 to CL8_9 can correspond to three CL modes, the CAS latency mode control unit 100 outputs the controlled internal signal oe00i without delay or after a predetermined delay time which corresponds to one cycle of the clock signal iclk is passed or after a predetermined delay time which corresponds to two cycles of the clock signal iclk is passed depending on the CL.

The present application contains subject matter related to Korean patent application No. 2003-76801, filed in the Korean Patent Office on Oct. 31, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data output control circuit for use in a synchronous semiconductor memory device which has a plurality of CAS latency modes, comprising:
   a signal generating unit for generating an internal signal corresponding to an input command;
   a CAS latency mode control unit for outputting the internal signal as a controlled internal signal;
   a signal shifting unit for generating a plurality of shifted signals by synchronizing the controlled internal signal with a DLL clock signal; and
   a data output enable signal generating unit for outputting one of the plurality of shifted signals as a data output enable signal depending on a plurality of control signals, wherein each of the plurality of control signals corresponds to two or more continuous CAS latency modes.

2. The data output control circuit as recited in claim 1, wherein if each of the plurality of control signals corresponds to two continuous CAS latency modes, the controlled internal signal is outputted without delay or after one clock cycle of the DLL clock signal.

3. The data output control circuit as recited in claim 1, wherein if each of the plurality of control signals corresponds to three continuous CAS latency modes, the controlled internal signal is outputted without delay or after one or two clock cycles of the DLL clock signal.

4. The data output control circuit as recited in claim 2, wherein the CAS latency mode control unit includes:
   a first transferring gate turned on by a first group of CAS latency modes to output the internal signal as the controlled internal clock signal without delay;
   a clock delay unit for delaying the internal clock signal for a predetermined delay time which corresponds to one cycle of the clock signal; and
   a second transferring gate turned of by a second group of CAS latency modes for receiving an outputted signal from the clock delay unit and outputting the outputted signal as the controlled internal clock signal.

5. The data output control circuit as recited in claim 4, wherein the clock delay unit includes a flip-flop for receiving the clock signal through its clock input terminal and for receiving the internal signal through its data input terminal.

6. The data output control circuit as recited in claim 5, wherein the flip-flop is a D-type flip-flop.

7. The data output control circuit as recited in claim 4, wherein the signal shifting unit includes a plurality of D-type flip-flops, wherein each of the plurality of D-type flip-flops receives the DLL clock signal, and a first D-type flip-flop of the plurality of D-type flip-flops receives the internal signal, and an outputted signal from a sub output terminal of a previous D-type flip-flop is inputted to a data input terminal of a next D-type flip-flop.

8. The data output control circuit as recited in claim 7, wherein the data output enable signal generating unit includes:
   a plurality of transferring gates which receive the plurality of shifted signals and are selectively turned on by the plurality of control signals; and
   a buffering unit for receiving an output signal from the plurality of transferring gates and outputting the received output signal as the data output enable signal.

9. The data output control circuit as recited in claim 8, wherein the data output enable signal generating unit is enabled in response to a power-up signal.

10. The data output control circuit as recited in claim 1 further includes a CAS latency control signal generating unit for generating the plurality of control signals depending on the CAS latency mode.

11. The data output control circuit as recited in claim 10, each of plurality of control signals corresponds to two continuous CAS latency modes.

12. The data output control circuit as recited in claim 1 further includes a DLL output pulse control unit which delays the DLL clock signal for different delay time periods depending on CAS latency modes in order to output delayed DLL clock signals, wherein the plurality of shifted signals are outputted synchronously with the delayed DLL clock signals.

* * * * *